United States Patent
Lee (10) Patent No.: US 10,411,707 B1
(45) Date of Patent: Sep. 10, 2019

(54) SYSTEMS AND METHODS FOR IMPROVING SIGNAL MARGIN FOR INPUT BUFFER CIRCUITS

(71) Applicant: Micron Technology, Inc., Boise, ID (US)

(72) Inventor: Hyun Yoo Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/051,117

(22) Filed: Jul. 31, 2018

(51) Int. Cl.
*H03K 19/0185* (2006.01)
*H03F 3/45* (2006.01)

(52) U.S. Cl.
CPC ..... *H03K 19/01855* (2013.01); *H03F 3/4508* (2013.01); *H03F 3/45376* (2013.01)

(58) Field of Classification Search
CPC .......... H03K 19/01855; H03F 3/45376; H03F 3/4508
USPC .......................................................... 326/87
See application file for complete search history.

(56) References Cited

U.S. PATENT DOCUMENTS

| | | | |
|---|---|---|---|
| 6,222,388 B1 * | 4/2001 | Bridgewater, Jr. | ......................... H03K 19/0016 326/57 |
| 6,281,715 B1 * | 8/2001 | DeClue | .......... H03K 19/018528 327/108 |
| 6,801,061 B2 * | 10/2004 | Cowles | .............. H03K 19/0016 326/82 |
| 7,256,626 B2 * | 8/2007 | Nguyen | ................. H03K 5/135 326/83 |
| 7,362,146 B2 * | 4/2008 | Macaluso | ........... H04L 25/0272 326/82 |

* cited by examiner

*Primary Examiner* — Daniel D Chang
(74) *Attorney, Agent, or Firm* — Fletcher Yoder, P.C.

(57) ABSTRACT

An input buffer circuit may include a first switch that may couple a first voltage source to an output line based on an enable signal, such that the enable signal is configured to cause the input buffer circuit to operate. The input buffer circuit may also include a first set of switches that may couple the first voltage source to the output line based on the enable signal and an input signal, wherein the first switch and the first set of switches may couple the first voltage source to the output line in response to the input signal being greater than an input reference signal. The input buffer circuit may also include a switch that may couple a second voltage source to the output line in response to the input signal being less than the input reference signal.

20 Claims, 6 Drawing Sheets

SYSTEMS AND METHODS FOR IMPROVING SIGNAL MARGIN FOR INPUT BUFFER CIRCUITS

BACKGROUND

Field of the Present Disclosure

Embodiments of the present disclosure relate generally to the field of semiconductor devices. More specifically, embodiments of the present disclosure relate to input buffer circuits used in semiconductor devices.

Description of Related Art

Electronic devices, such as semiconductor devices, memory chips, microprocessor chips, image chips, and the like may receive data for storage, operations, analysis, and the like. As electronic devices operate at higher frequencies, it become increasingly difficult to accurately sample the input signals received by the devices. In addition to increased speed, the electronic devices are also improving to operate at lower voltages, thereby consuming less energy. However, the lower voltage sources also decrease the ability of the devices to accurately sample the received input signals. With this in mind, it is desirable to provide improved systems and methods for accurately detecting the input signals received by various types of electronic devices.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Certain semiconductor devices (e.g., memory devices) may include input buffer circuits that are continuously powered to be capable of receiving data as they are transmitted from other data sources. To reduce standby current consumption while the input buffer circuit receives power, in certain embodiments, the input buffer circuit may receive an enable signal to transition the input buffer circuit from a standby mode that reduces current consumption to a receiving mode that receives data being transmitted. When the input buffer circuit does not receive the enable signal, the input buffer circuit may include a current path that dissipates some of the energy provided to the input buffer circuit.

When the input buffer circuit receives the enable signal, the input buffer circuit may connect an additional current path between the input buffer circuit and a power source to improve a margin of an input signal being received by the input buffer circuit. That is, the additional current path may enable the input buffer circuit to reach a voltage level or amplitude of the input signal more efficiently using multiple current paths, as compared to using fewer current paths. The increased margin enables the input buffer circuit to have a larger eye diagram, as compared to input circuit buffer circuits without the additional current paths. Additional details with regard to the functionality of the input buffer circuit will be discussed below with reference to FIGS. 1-9.

Figure 1:
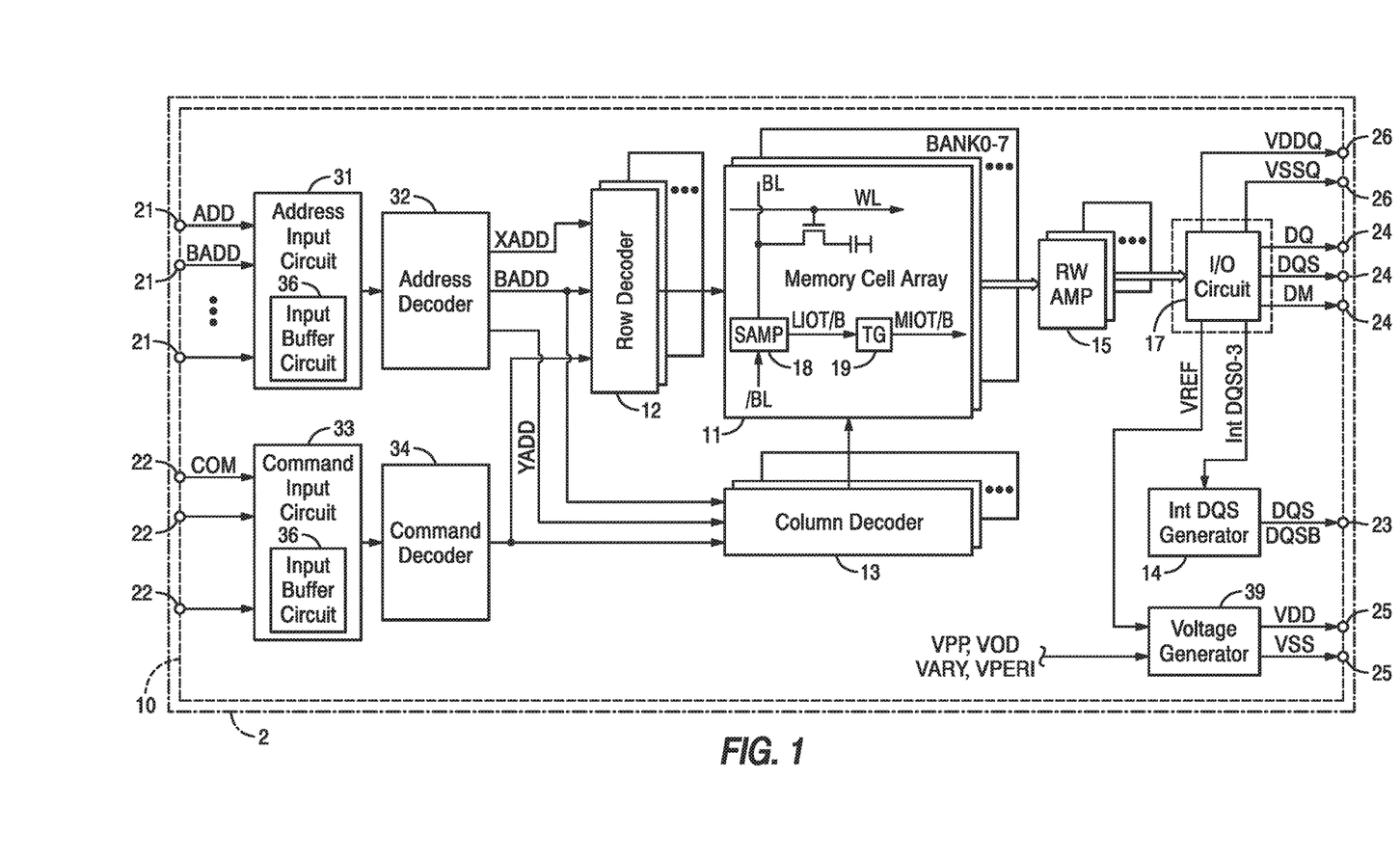
FIG. 1 is a simplified block diagram illustrating a semiconductor device that includes differential input buffers for receiving address data and command data, according to an embodiment of the present disclosure.

Turning now to the figures, FIG. 1 is a block diagram of a semiconductor device in accordance with an embodiment of the present disclosure. The semiconductor device 10 may be any suitable memory device, such as an LPDDR4 SDRAM integrated into a single semiconductor chip, for example. The semiconductor device 10 may be mounted on an external substrate 2 that is a memory module substrate, a mother board or the like. The semiconductor device 10 may include a plurality of memory banks each has a plurality of memory cell arrays 11. Each memory cell array 11 may include a plurality of word lines WL, a plurality of bit lines BL, and a plurality of memory cells MC arranged at intersections of the plurality of word lines WL and the plurality of bit lines BL. The selection of the word line WL is performed by a row decoder 12 and the selection of the bit line BL is performed by a column decoder 13. Sense amplifiers 18 are coupled to corresponding bit lines BL and connected to local input/output (I/O) line pairs LIOT/B. Local 10 line pairs LIOT/B are connected to main IO line pairs MIOT/B via transfer gates TG 19 which function as switches.

Turning to the explanation of a plurality of external terminals included in the semiconductor device 10, the plurality of external terminals includes address terminals 21, command terminals 22, data strobe (DQS) terminals 23, data (DQ) terminals 24 and power supply terminals 25 and 26. The data terminals 24 may be coupled to output buffers for read operations of memories. Alternatively, the data terminals 24 may be coupled to input buffers for read/write access of the memories.

The address terminals 21 are supplied with an address signal ADD and a bank address signal BADD. The address signal ADD and the bank address signal BADD supplied to the address terminals 21 are transferred via an address input circuit 31 to an address decoder 32. The address decoder 32 receives the address signal ADD and supplies a decoded row address signal XADD to the row decoder 12, and a decoded column address signal YADD to the column decoder 13. The address decoder 32 also receives the bank address signal BADD and supplies the bank address signal BADD to the row decoder 12 and the column decoder 13.

The command terminals 22 are supplied with a command signal COM. The command signal COM may include one or more separate signals. The command signal COM input to the command terminals 21 is input to a command decoder 34 via the command input circuit 33. The command decoder 34 decodes the command signal COM to generate various internal command signals. For example, the internal commands may include a row command signal to select a word line and a column command signal, such as a read command or a write command, to select a bit line.

Although the address terminals 21 and the command terminals 22 are illustrated in FIG. 1 as being separate terminals, it should be noted that in some embodiments the address input circuit 31 and the command input circuit 33 may receive address signals ADD and command signals COM via one or more address and command terminals. That is, the address signals ADD and command signals COM may be provided to the semiconductor device 10 via the same terminal. For instance, the address and command terminals may provide an address signal at a falling clock edge (e.g., in synchronism with clock falling edge) and a command signal at a rising clock edge (e.g., in synchronism with clock rising edge). With this in mind, it should be understood that the description provided in the present disclosure with the separate address terminals 21 and command terminals 22 is included for discussion purposes and the techniques described herein should not be limited to using separate address terminals 21 and command terminals 22.

Accordingly, when a read command is issued and a row address and a column address are timely supplied with the read command, read data is read from a memory cell MC in the memory cell array 11 designated by these row address and column address. The read data DQ is output externally from the data terminals 24 via a read/write amplifier 15 and an input/output (IO) circuit 17. Similarly, when the write command is issued and a row address and a column address are timely supplied with the write command, and then write data DQ is supplied to the data terminals 24, the write data DQ is supplied via the input/output circuit 17 and the read/write amplifier 15 to the memory cell array 11 and written in the memory cell MC designated by the row address and the column address.

The input/output circuit 17 may include input buffers, according to one embodiment. The input/output circuit 17 receives external clock signals as a timing signal for determining input timing of write data DQ and output timing of read data DQ.

The power supply terminals 25 are supplied with power supply potentials VDD and VSS. These power supply potentials VDD and VSS are supplied to a voltage generator 39. The voltage generator 39 may generate various internal potentials VPP, VOD, VARY, VPERI, and the like based on the power supply potentials VDD and VSS. The internal potential VPP may be mainly used in the row decoder 12, the internal potentials VOD and VARY may be mainly used in the sense amplifiers 18 included in the memory cell array 11, and the internal potential VPERI may be used in many other circuit blocks.

Power supply potentials VDDQ and VSSQ are supplied to the input/output circuit 17. The power supply potentials VDDQ and VSSQ may be the same potentials as the power supply potentials VDD and VSS that are supplied to the power supply terminals 25, respectively. However, the dedicated power supply potentials VDDQ and VSSQ may be used for the input/output circuit 17 so that power supply noise generated by the input/output circuit 17 does not propagate to the other circuit blocks.

The input/output circuit 17 may also be coupled to an internal data strobe (DQS) generator circuit 14. The data strobe terminals 23 are supplied with external data strobe signals DQS and DQSB, respectively. These external data strobe signals DQS and DQSB are complementary to each other and are supplied to the internal data strobe (DQS) generator circuit 14. The internal data strobe (DQS) generator circuit 14 may generate a plurality of internal data strobe signals (e.g., Int DQS 0-3).

Referring back to the address input circuit 31 and the command input circuit 33, in certain embodiments, these circuits may include input buffer circuits 36. The input buffer circuits 36 may receive the address signals ADD and the bank address signals BADD for the address input circuit 31 and may receive command signals COM for the command input circuit 33. To effectively receive the address signals ADD, the bank address signals BADD, and the command signals COM, the input buffer circuits 36 may include differential operational amplifiers (op-amp) that may amplify the signal received by the input buffer circuits 36.

Figure 2:
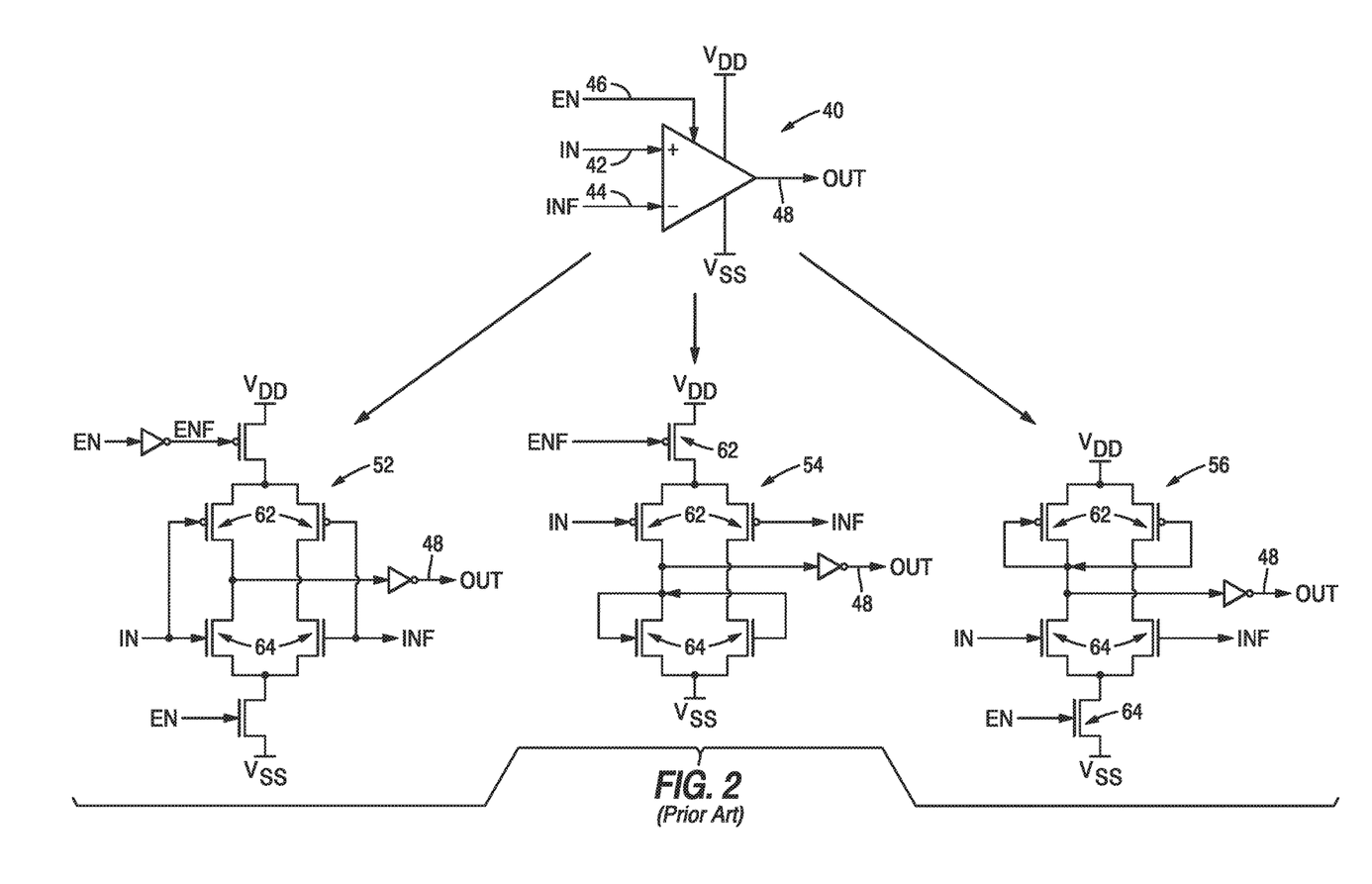
FIG. 2 is a schematic diagram illustrating three transistor-level implementations of a first differential amplifier that may be part of the semiconductor device of FIG. 1, according to an embodiment of the present disclosure.

By way of example, FIG. 2 illustrates a differential op-amp circuit 40 that may be employed by the input buffer circuit 36. As shown in FIG. 2, the differential op-amp circuit 40 may also receive power from a first voltage source VDD and a second voltage source VSS. In addition, the differential op-amp circuit 40 may receive input signal IN and an input reference signal INF via input line 42 and input line 44. The differential op-amp circuit 40 may also receive an enable signal EN at an enable line 46, such that the enable signal EN may cause the differential op-amp circuit 40 to operate and output an output signal OUT via an output line 48.

The differential op-amp circuit 40 may be implemented in a variety of manners. By way of example, circuit diagrams 52, 54, and 56 of FIG. 2 illustrate three transistor-level implementations for the differential op-amp circuit 40. Referring to each of the circuit diagrams 52, 54, or 56, the enable signal EN may cause the differential op-amp circuit 40 to operate and output the output signal OUT based on the differential signal between the input signal IN and the input reference signal INF. That is, P-type switches 62 and N-type switches 64 may operate in any of the circuit diagrams 52, 54, or 56, to cause the output signal OUT to be a voltage value that corresponds to a logic 1 when the input signal IN is greater than the input reference signal INF and cause the output signal OUT to be a voltage value that corresponds to a logic 0 when the input signal IN is less than the input reference signal INF.

With the foregoing in mind, in some embodiments, the single P-type switch 62 or the single N-type switch 64 that couples the voltage source VDD or VSS to the output line 48 based on the enable signal EN may not provide a sufficient margin or amplitude of the corresponding voltage signal to the output line 48 during a cycle of operation. That is, when the differential op-amp circuit 40 receives the input signal IN, the corresponding data eye diagram for the received input signal IN may be reduced in size due to the single current path between the voltage source VDD or VSS across the single P-type switch 62 or the single N-type switch 64 controlled by the enable signal EN.

It should be noted that the P-type switches and the N-type switches described herein may include any suitable transistor-type switch such as a Bipolar junction transistor, a field-effect transistor, and the like. In addition, although certain embodiments described herein are depicted as using P-type switches or N-type switches, it should be understood that the polarity of the switches may be reversed by reversing the input signal polarity, connection, or the like.

Figure 3:
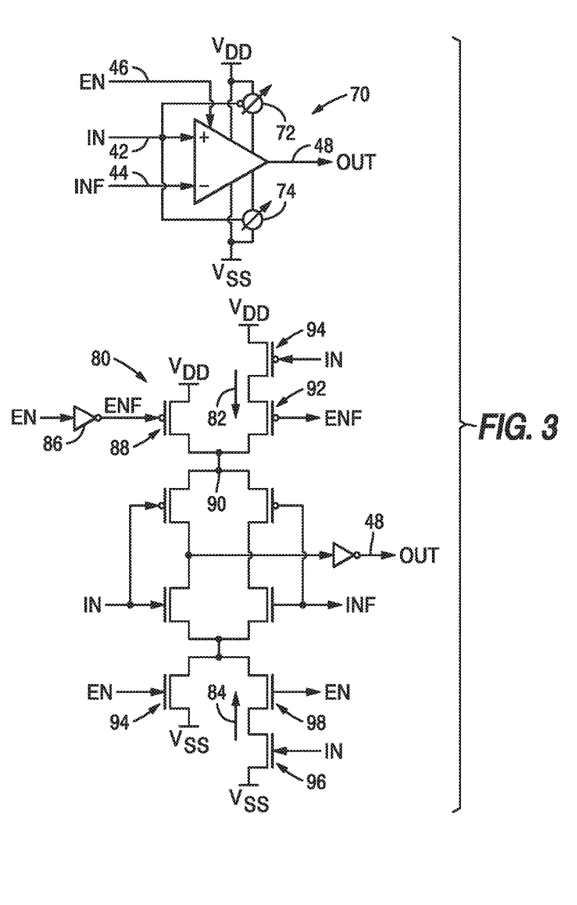
FIG. 3 is a schematic diagram illustrating a second differential amplifier and a corresponding transistor-level implementation of the second differential amplifier that may be part of the semiconductor device of FIG. 1, according to an embodiment of the present disclosure.

With the foregoing in mind, FIGS. 3-6 illustrate different embodiments of a differential op-amp circuit that may be implemented in the input buffer circuit 36. Referring first to FIG. 3, a differential op-amp circuit 70 may include the input line 42, the input reference line 44, the enable line 46, and the output line 48, as described above with reference to FIG. 2. In some embodiments, the differential op-amp circuit 70 may also include variable resistors 72 and 74. The variable resistors 72 and 74 may be adjusted to match the switches within the differential op-amp circuit 70.

Circuit diagram 80 of FIG. 3 illustrates a transistor-level implementation of the differential op-amp circuit 70. Comparing the circuit diagram 80 of FIG. 3 to the circuit diagram 52 of FIG. 2, it may become clear that the circuit diagram 80 includes an additional current path 82 between the voltage source VDD and the output line 48 or an additional current path 84 between the voltage source VSS and the output line 48. By providing these additional current paths 82 and 84 between the voltage source VDD or VSS and the output line 48, the output line 48 may effectively include a higher margin voltage signal, as compared to the operation of the differential op-amp circuit 40 of FIG. 2.

For example, after receiving the enable signal EN (e.g., logic 1 or high) at an inverter 86, the inverter 86 may output an inverse enable signal ENF, which may cause the P-type switch 88 to turn on, thereby coupling the voltage source VDD to node 90. In the same manner, the inverse enable signal ENF is received by P-type switch 92; however, the voltage source VDD will not be coupled to the node 90 until the input signal IN is less than the input reference signal INF due to the P-type switch 94. In this way, regardless of whether the input signal IN is being received or not, when the enable signal EN is provided to the differential op-amp circuit 70, at least one current path is provided for the voltage source VDD for standby operations. However, when the input signal IN is provided to the differential op-amp circuit 40, while the enable signal EN is also provided to the differential op-amp circuit 70, the voltage source VDD may have access to two current paths to the node 90. As a result, the output line 48 may receive a voltage signal that increases to a voltage value associated with the voltage source VDD more quickly, as compared to using just one current path.

Figure 7:
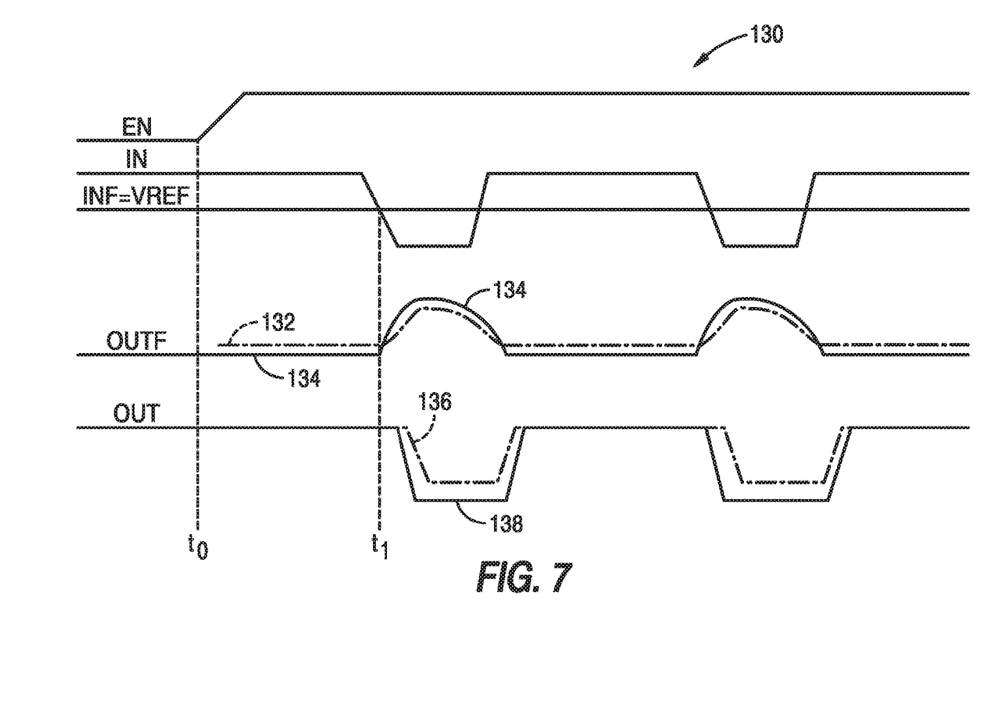
FIG. 7 is a timing diagram of a number of waveforms representative of a first operation scenario of the differential amplifier of FIG. 3, according to an embodiment of the present disclosure.

Keeping this in mind, FIG. 7 illustrates a timing diagram 130 that describes the operation of the differential op-amp circuit 70 of FIG. 3 as compared to the operation of the differential op-amp circuit 40 of FIG. 2. Referring to the timing diagram 130, at time to, the enable signal EN may be provided to the respective circuits. At time ti, the input signal IN may become less than the input reference signal INF. As such, an inverse output signal OUTF for each differential op-amp circuit 40 and 70 may increase as shown. Inverse output signal 132 corresponds to the inverse output signal of the differential op-amp circuit 40 and inverse output signal 134 corresponds to the inverse output signal of the differential op-amp circuit 70. In the same manner, output signal 136 corresponds to the output signal of the differential op-amp circuit 40 and output signal 138 corresponds to the output signal of the differential op-amp circuit 70. As can be appreciated, the amplitude of the output signal 138 is larger than the amplitude of the output signal 136. As a result, the differential op-amp circuit 70 may provide improved data eye diagrams for the input signals IN.

Figure 8:
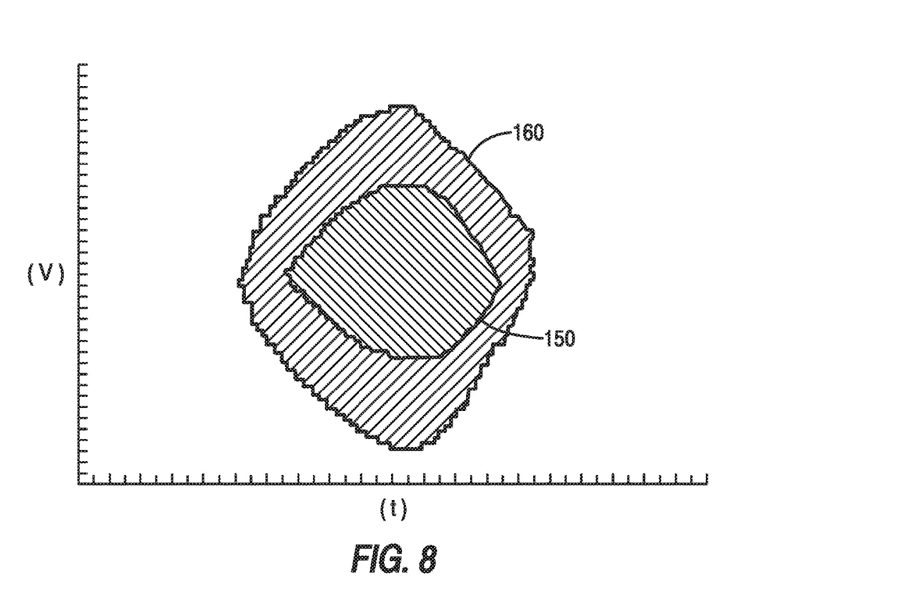
FIG. 8 is a data eye diagram representative of the input signal received at the differential amplifier of FIG. 2, according to an embodiment of the present disclosure.
Figure 9:
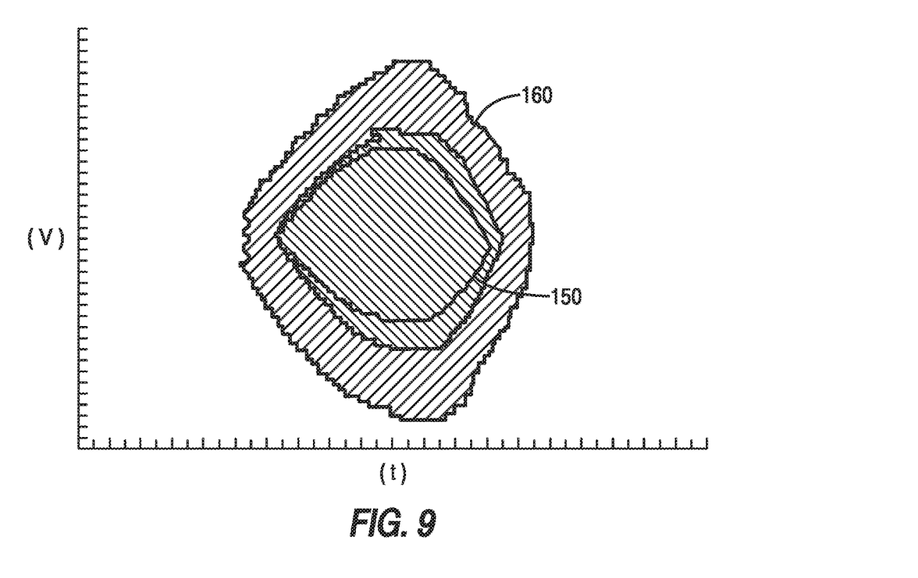
FIG. 9 is a data eye diagram representative of the input signal received at the differential amplifier of FIG. 3, according to an embodiment of the present disclosure.

To further illustrate the improved eye diagram, FIG. 8 illustrates an eye diagram 150 that may represent an example output signal of the differential op-amp circuit 40. In contrast, FIG. 9 illustrates an eye diagram 160 that may represent an example output signal of the differential op-amp circuit 70. As shown in FIG. 9, the eye diagram 160 is larger or includes a greater voltage margin, as compared to the eye diagram 150 of FIG. 8. That is, the additional current paths 82 and 84 provided in the differential op-amp circuit 70 enable the output signals to reach their respective voltage levels more efficiently by using the additional current paths 82 and 84.

With the foregoing in mind and referring back to FIG. 3, the circuit diagram 80 includes N-type switch 94, N-type switch 96, and N-type switch 98 that operate similar to P-type switch 88, P-type switch 92, and P-type switch 94, respectively. That is, the N-type switch 96 and the N-type switch 98 may provide an additional current path 84 to the output line 48, thereby enabling the voltage level of the output line 48 to reach a desired voltage level associated with the voltage source VSS more efficiently.

Figure 4:
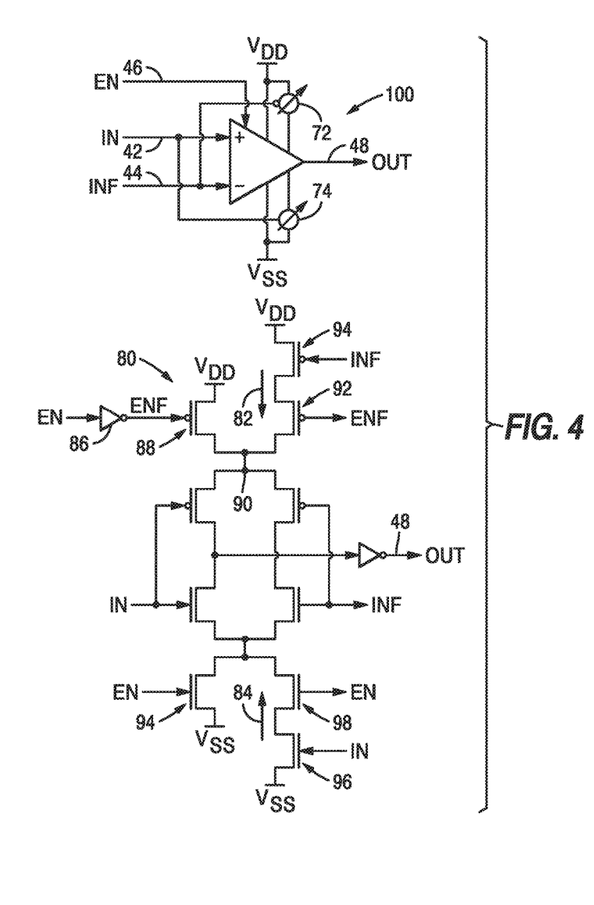
FIG. 4 is a schematic diagram illustrating a third differential amplifier and a corresponding transistor-level implementation of the third differential amplifier that may be part of the semiconductor device of FIG. 1, according to an embodiment of the present disclosure.

FIG. 4 illustrates a differential op-amp circuit 100 that is similar to the differential op-amp circuit 70 of FIG. 3 in that the circuit diagram 80 of the differential op-amp circuit 100 is the same as the one used for the differential op-amp circuit 70. However, the variable resistors 72 and 74 may be coupled to the input line 42 and to the input reference line 44 in a different fashion. Specifically, both of the variable resistors 72 and 74 are coupled to the input line 42, while the variable resistors 72 and 74 are coupled to the input reference line 44 and the input line 42, respectively in the differential op-amp circuit 100. As such, the variable resistor 72 may be used to match the transistors of the circuit diagram 80.

Figure 5:
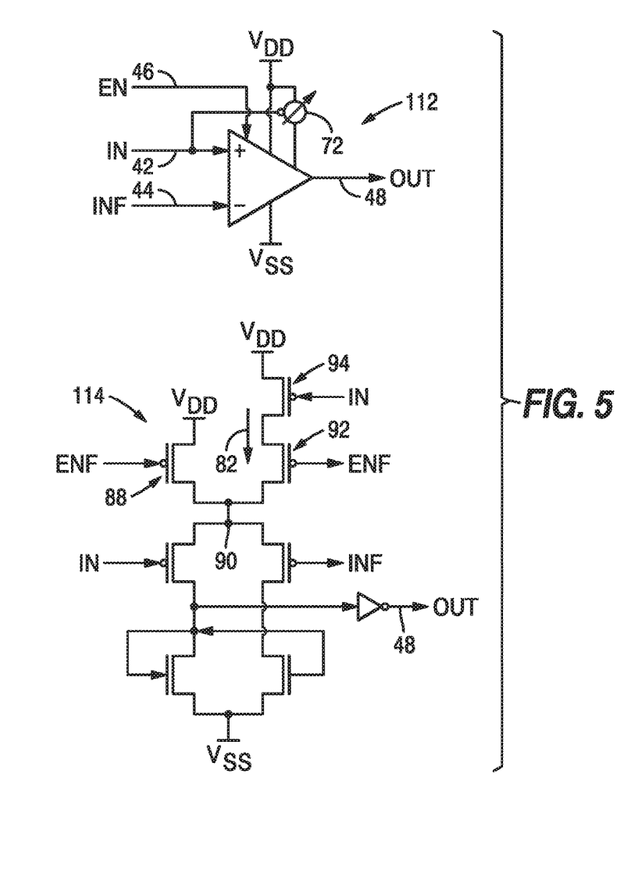
FIG. 5 is a schematic diagram illustrating a fourth differential amplifier and a corresponding transistor-level implementation of the fourth differential amplifier that may be part of the semiconductor device of FIG. 1, according to an embodiment of the present disclosure.
Figure 6:
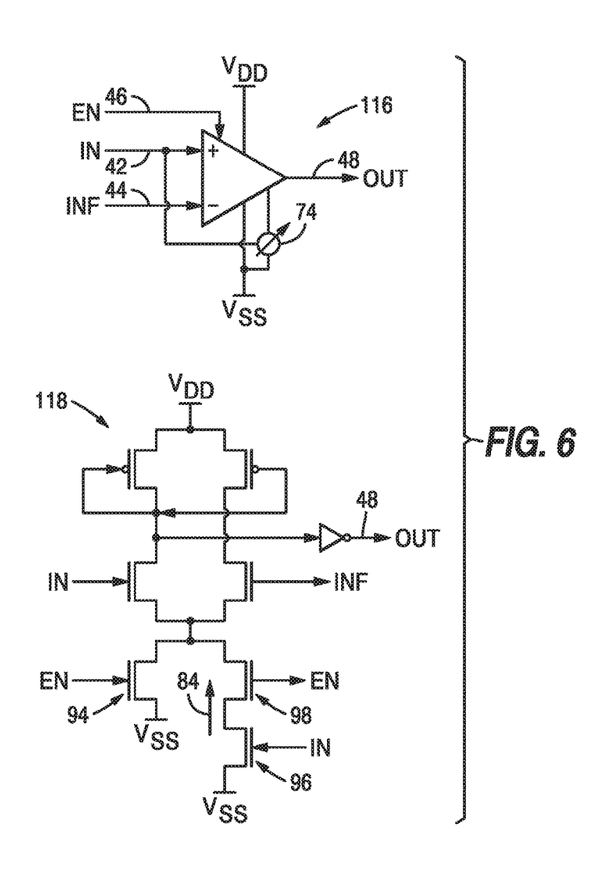
FIG. 6 is a schematic diagram illustrating a fifth differential amplifier and a corresponding transistor-level implementation of the fifth differential amplifier that may be part of the semiconductor device of FIG. 1, according to an embodiment of the present disclosure.

FIG. 5 illustrates another example embodiment of a differential op-amp circuit 112 that employs the additional current path 82 for the voltage source VDD and does not include the additional current path 84 for the voltage source VSS, as shown in the circuit diagram 114. In addition, the differential op-amp circuit 112 may include the variable resistor 72 coupled to the input line 42, while the variable resistor 74 may be omitted. With the differential op-amp circuit 112 of FIG. 5 in mind, FIG. 6 illustrates a mirrored version of the differential op-amp circuit 112 with a differential op-amp circuit 116. The differential op-amp circuit 116 employs the additional current path 84 for the voltage source VSS and does not include the additional current path 82 for the voltage source VDD, as shown in the circuit diagram 118. In addition, the differential op-amp circuit 112 may include the variable resistor 74 coupled to the input line 42, while the variable resistor 72 may be omitted.

With the foregoing descriptions of each differential op-amp circuit described in FIGS. 3-6 in mind, it should be noted that certain differential op-amp circuits may be used for different applications. For example, the differential op-amp circuit 70 of FIG. 3 may be used to connect the input referred sinks to the both of PMOS and NMOS switches. That is, it may be beneficial to employ center tapped termination logic because of push-pull operation. In the same manner, the differential op-amp circuit 100 of FIG. 4 may be used to employ center tapped termination logic but for differential signaling.

With regard to the differential op-amp circuit 112 of FIG. 5, the input referred sinks are connected to the PMOS switches not the NMOS switches. As such, the differential op-amp circuit 112 may be used for VDD termination logic. In the same manner, the input referred sinks of the differential op-amp circuit 116 in FIG. 6 are connected to the NMOS switches, as opposed to the PMOS switches. As such, the differential op-amp circuit 116 may be used for VSS termination logic.

Although the foregoing discussion of the various embodiments for the input buffer circuit 36 has been detailed as being implemented into the address input circuit 31 and/or the command input circuit 33, it should be noted that the input buffer circuit 36 may be incorporated into any suitable number of circuits that receive data signals. For example, the input buffer circuit 36 with the variety of differential op-amp circuits described in FIGS. 3-6 may be implemented in a DQ input circuit, a clock input circuit and the like. Indeed, the input buffer circuit 36 described herein may be incorporated into any suitable buffer circuit.

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An input buffer circuit, comprising:
a first switch configured to couple a first voltage source to an output line based on an enable signal, wherein the enable signal is configured to cause the first switch to couple the first voltage source to the output line to output a voltage via the output line;
a first set of switches configured to couple the first voltage source to the output line based on the enable signal and an input signal, wherein the first set of switches is configured to couple the first voltage source to the output line in response to the input signal being greater than an input reference signal, and wherein the first set of switches is configured to amplify the voltage output via the output line; and
a second switch configured to couple a second voltage source to the output line in response to the input signal being less than the input reference signal.

2. The input buffer circuit of claim 1, comprising a variable resistor configured to couple to an input line configured to receive the input signal.

3. The input buffer circuit of claim 2, comprising an additional variable resistor configured to couple to an input reference line configured to receive the input reference signal.

4. The input buffer circuit of claim 1, comprising a variable resistor configured to couple to an input reference line configured to receive the input reference signal.

5. The input buffer of claim 1, wherein the first set of switches are coupled in series with each other.

6. The input buffer of claim 1, wherein a first one of the first set of switches is configured to receive the input signal and a second one of the first set of switches is configured to receive the enable signal.

7. The input buffer of claim 1, wherein the first switch and the first set of switches comprise a plurality of P-type switches.

8. The input buffer of claim 1, comprising a second set of switches configured to couple the second voltage source to the output line based on the enable signal and the input signal, wherein the second switch and the second set of switches are configured to couple the second voltage source to the output line in response to the input signal being less than the input reference signal.

9. The input buffer of claim 8, wherein the second switch and the second set of switches comprise a plurality of N-type switches.

10. A semiconductor device comprising:
a buffer circuit configured to receive:
a data signal representative of a logic high value or a logic low value; and
an enable signal configured to cause the buffer circuit to operate;
a differential op-amp circuit configured to:
receive the data signal at a first switch of a plurality of switches configured to couple a first voltage source to an output line of the differential op-amp circuit;
receive the enable signal at a second switch;
couple the first voltage source to the output line of the differential op-amp circuit via the plurality of switches and the second switch in response to the data signal being less than a reference signal and the enable signal being received at the second switch, wherein the first voltage source is coupled to the output line via two separate current paths, and wherein each of the two separate current paths comprise the first switch and the second switch, respectively; and
couple a second voltage source to the output line in response to the data signal being greater than the reference signal.

11. The semiconductor device of claim 10, wherein a first current path of the two separate current paths comprises comprises at least two switches.

12. The semiconductor device of claim 10, wherein the differential op-amp circuit is configured to couple the second voltage source to the output line via two additional separate current paths.

13. The semiconductor device of claim 12, wherein a first additional current path of the two separate additional current paths comprises a first additional switch, and wherein a second additional current path of the two separate additional current paths comprises at least two switches.

14. The semiconductor device of claim 12, wherein the enable signal is configured to cause the differential op-amp circuit to operate.

15. The semiconductor device of claim 10, wherein the buffer circuit comprises an address input circuit or a command input circuit.

16. The semiconductor device of claim 10, wherein the differential op-amp circuit comprises a variable resistor configured to couple to an input line configured to receive the data signal.

17. A method, comprising:
receiving, via a circuit, an input signal at a first switch of the circuit; and
coupling, via the circuit, an output line to a first voltage source via at least two current paths in response to the input signal being less than an input reference signal and an enable signal being received at the circuit, wherein a first current path of the at least two current paths comprises the first switch, wherein a second current path of the at least two current paths comprises at least two switches, and wherein one of the at least two switches is configured to close in response to the enable signal being received at the one of the at least two switches.

18. The method of claim 17, wherein the first switch and the at least two switches comprise P-type switches.

19. The method of claim 17, comprising coupling, via the circuit, the output line to a second voltage source via at least two additional current paths in response to the input signal being greater than the input reference signal, wherein a first additional current path of the at least two additional current paths comprises a second switch, and wherein a second additional current path of the at least two additional current paths comprises at least two additional switches.

20. The method of claim 19, wherein the second switch and the at least two additional switches comprise N-type switches.

* * * * *

UNITED STATES PATENT AND TRADEMARK OFFICE
CERTIFICATE OF CORRECTION

PATENT NO. : 10,411,707 B1  
APPLICATION NO. : 16/051117  
DATED : September 10, 2019  
INVENTOR(S) : Hyun Yoo Lee

Page 1 of 1

It is certified that error appears in the above-identified patent and that said Letters Patent is hereby corrected as shown below:

In the Claims

Column 8, Line 60, Claim 11, delete "paths comprises comprises," and insert -- paths comprises, --, therefor.

Signed and Sealed this
Twenty-second Day of October, 2019

Andrei Iancu
*Director of the United States Patent and Trademark Office*